US012646552B2

(12) United States Patent
Zeng et al.

(10) Patent No.: US 12,646,552 B2
(45) Date of Patent: Jun. 2, 2026

(54) MEMORY MANAGEMENT METHOD, MEMORY STORAGE DEVICE AND MEMORY CONTROL CIRCUIT UNIT WITH CAPABILITY TO REDUCE BIT ERROR RATE OF DATA

(71) Applicant: PHISON ELECTRONICS CORP., Miaoli (TW)

(72) Inventors: Shih-Jia Zeng, Hsinchu City (TW); Chen Yang Tang, Taoyuan City (TW); Hsuan Ming Kuo, Taipei City (TW); Shi-Chieh Hsu, Taichung City (TW); Wei Lin, Taipei City (TW)

(73) Assignee: PHISON ELECTRONICS CORP., Miaoli (TW)

( * ) Notice: Subject to any disclaimer, the term of this patent is extended or adjusted under 35 U.S.C. 154(b) by 225 days.

(21) Appl. No.: 18/481,998

(22) Filed: Oct. 5, 2023

(65) Prior Publication Data

US 2025/0078897 A1       Mar. 6, 2025

(30) Foreign Application Priority Data

Sep. 6, 2023     (TW) ................................. 112133843

(51) Int. Cl.
*G11C 11/406*          (2006.01)
*G11C 29/52*           (2006.01)
(52) U.S. Cl.
CPC .. *G11C 11/40607* (2013.01); *G11C 11/40618* (2013.01); *G11C 29/52* (2013.01)

(58) Field of Classification Search
CPC ........ G11C 11/40607; G11C 11/40618; G11C 29/52; G11C 2029/0409; G11C 2029/0411
See application file for complete search history.

(56) References Cited

U.S. PATENT DOCUMENTS

| | | | |
|---|---|---|---|
| 2016/0350191 A1* | 12/2016 | Chen ....................... | G06F 3/064 |
| 2020/0075110 A1* | 3/2020 | Suzuki ................... | G11C 16/30 |
| 2022/0223217 A1 | 7/2022 | Na | |

FOREIGN PATENT DOCUMENTS

WO     WO-2023040592 A1 *   3/2023   ............. G09G 5/393

OTHER PUBLICATIONS

"Office Action of Taiwan Counterpart Application", issued on Nov. 22, 2024, p. 1-p. 4.

* cited by examiner

*Primary Examiner* — Sultana Begum
(74) *Attorney, Agent, or Firm* — JCIPRNET

(57) ABSTRACT
A memory management method, a memory storage device and a memory control circuit unit are disclosed. The method includes: detecting a status of a rewritable non-volatile memory module; and determining whether to perform a data refresh operation on the rewritable non-volatile memory module according to a first condition and a second condition. The first condition is related to a first physical unit in the rewritable non-volatile memory module. The second condition is related to a plurality of second physical units in the rewritable non-volatile memory module. The data refresh operation is configured to update data in the rewritable non-volatile memory module to reduce a bit error rate of the data.

22 Claims, 8 Drawing Sheets

MEMORY MANAGEMENT METHOD, MEMORY STORAGE DEVICE AND MEMORY CONTROL CIRCUIT UNIT WITH CAPABILITY TO REDUCE BIT ERROR RATE OF DATA

CROSS-REFERENCE TO RELATED APPLICATION

This application claims the priority benefit of Taiwan application serial no. 112133843 filed on Sep. 6, 2023. The entirety of the above-mentioned patent application is hereby incorporated by reference herein and made a part of this specification.

BACKGROUND

Technical Field

The disclosure relates to a memory management method, a memory storage device, and a memory control circuit unit.

Description of Related Art

The rapid growth of portable electronic devices such as mobile phones and laptops in recent years has led to a rapid increase in consumer demand for storage media. Since a rewritable non-volatile memory module (e.g. a flash memory) has the characteristics of data non-volatility, power saving, small size, and having no mechanical structure, it is very suitable for being built in a variety of portable electronic devices as exemplified above.

Some types of memory storage devices support data refresh operations on rewritable non-volatile memory modules to reduce the bit error rate (BER) of data stored in rewritable non-volatile memory modules. However, in practice, performing data refresh operations often significantly reduces the performance of the memory storage device, thereby reducing the operational stability of the memory storage device.

SUMMARY

A memory management method, a memory storage device, and a memory control circuit unit, which may improve the operational stability of the memory storage device, are provided in the disclosure.

An exemplary embodiment of the disclosure provides a memory management method configured for a rewritable non-volatile memory module. The memory management method includes the following operation. A status of a rewritable non-volatile memory module is detected. Whether to perform a data refresh operation on the rewritable non-volatile memory module is determined according to a first condition and a second condition. The first condition is related to a first physical unit in the rewritable non-volatile memory module. The second condition is related to multiple second physical units in the rewritable non-volatile memory module. The data refresh operation is configured to update data in the rewritable non-volatile memory module to reduce a bit error rate of the data.

An exemplary embodiment of the disclosure further provides a memory storage device, which includes a connection interface unit, a rewritable non-volatile memory module, and a memory control circuit unit. The connection interface unit is configured to couple to a host system. The memory control circuit unit is coupled to the connection interface unit and the rewritable non-volatile memory module. The memory control circuit unit is configured to perform the following operation. A status of a rewritable non-volatile memory module is detected. Whether to perform a data refresh operation on the rewritable non-volatile memory module is determined according to a first condition and a second condition. The first condition is related to a first physical unit in the rewritable non-volatile memory module. The second condition is related to multiple second physical units in the rewritable non-volatile memory module. The data refresh operation is configured to update data in the rewritable non-volatile memory module to reduce a bit error rate of the data.

An exemplary embodiment of the disclosure further provides a memory control circuit unit for controlling a rewritable non-volatile memory module. The memory control circuit unit includes a host interface, a memory interface, and a memory management circuit. The host interface is configured to couple to the host system. The memory interface is configured to couple to the rewritable non-volatile memory module. The memory management circuit is coupled to the host interface and the memory interface. The memory control circuit unit is configured to perform the following operation. A status of a rewritable non-volatile memory module is detected. Whether to perform a data refresh operation on the rewritable non-volatile memory module is determined according to a first condition and a second condition. The first condition is related to a first physical unit in the rewritable non-volatile memory module. The second condition is related to multiple second physical units in the rewritable non-volatile memory module. The data refresh operation is configured to update data in the rewritable non-volatile memory module to reduce a bit error rate of the data.

An exemplary embodiment of the disclosure further provides a memory storage device, which includes a connection interface unit, a rewritable non-volatile memory module, and a memory control circuit unit. The connection interface unit is configured to couple to a host system. The memory control circuit unit is coupled to the connection interface unit and the rewritable non-volatile memory module. The memory control circuit unit is configured to determine whether to perform a data refresh operation on the rewritable non-volatile memory module according to data access performance of the rewritable non-volatile memory module. The data refresh operation is configured to update data in the rewritable non-volatile memory module to reduce a bit error rate of the data.

Based on the above, after detecting the status of the rewritable non-volatile memory module, whether to perform a data refresh operation on the rewritable non-volatile memory module may be determined according to the first condition and the second condition. In particular, the first condition is related to a first physical unit in the rewritable non-volatile memory module, and the second condition is related to multiple second physical units in the rewritable non-volatile memory module. In addition, the data refresh operation is configured to update data in the rewritable non-volatile memory module to reduce a bit error rate of the data. Thereby, the operational stability of the memory storage device may be improved.

DETAILED DESCRIPTION OF DISCLOSED EMBODIMENTS

In general, a memory storage device (also referred to as a memory storage system) includes a rewritable non-volatile memory module and a controller (also referred to as a control circuit). The memory storage device may be used with a host system so that the host system may write data to or read data from the memory storage device.

Figure 1:
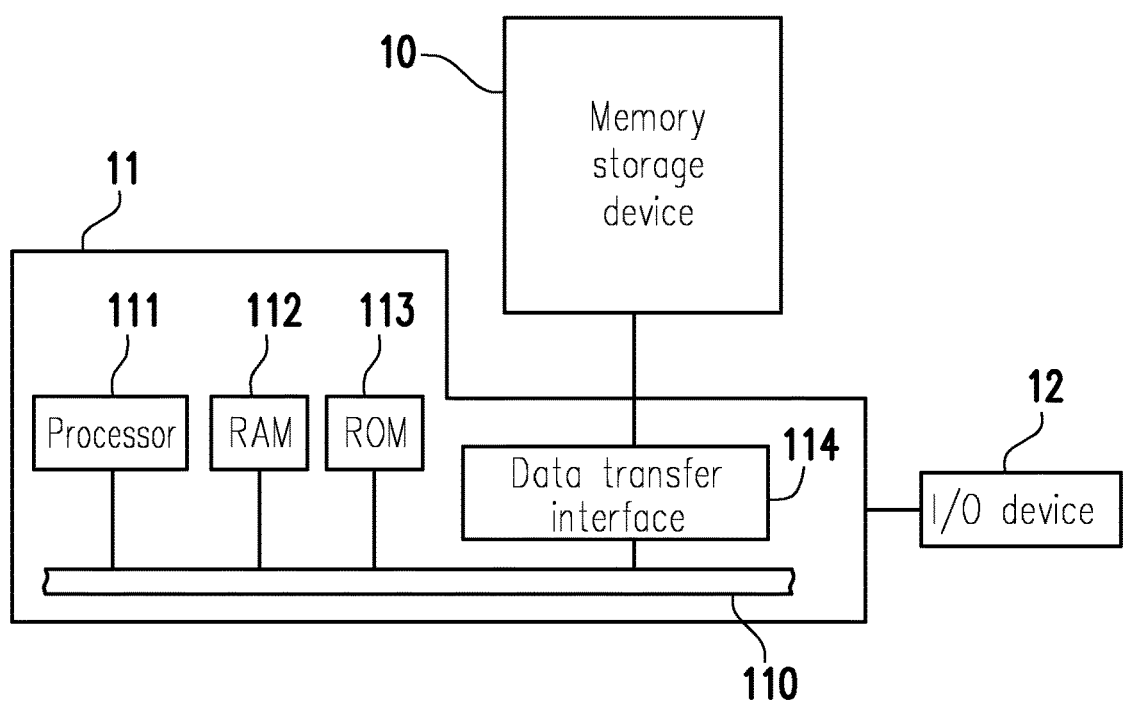
FIG. 1 is a schematic diagram of a host system, a memory storage device, and an input/output (I/O) device according to an exemplary embodiment of the disclosure.
Figure 2:
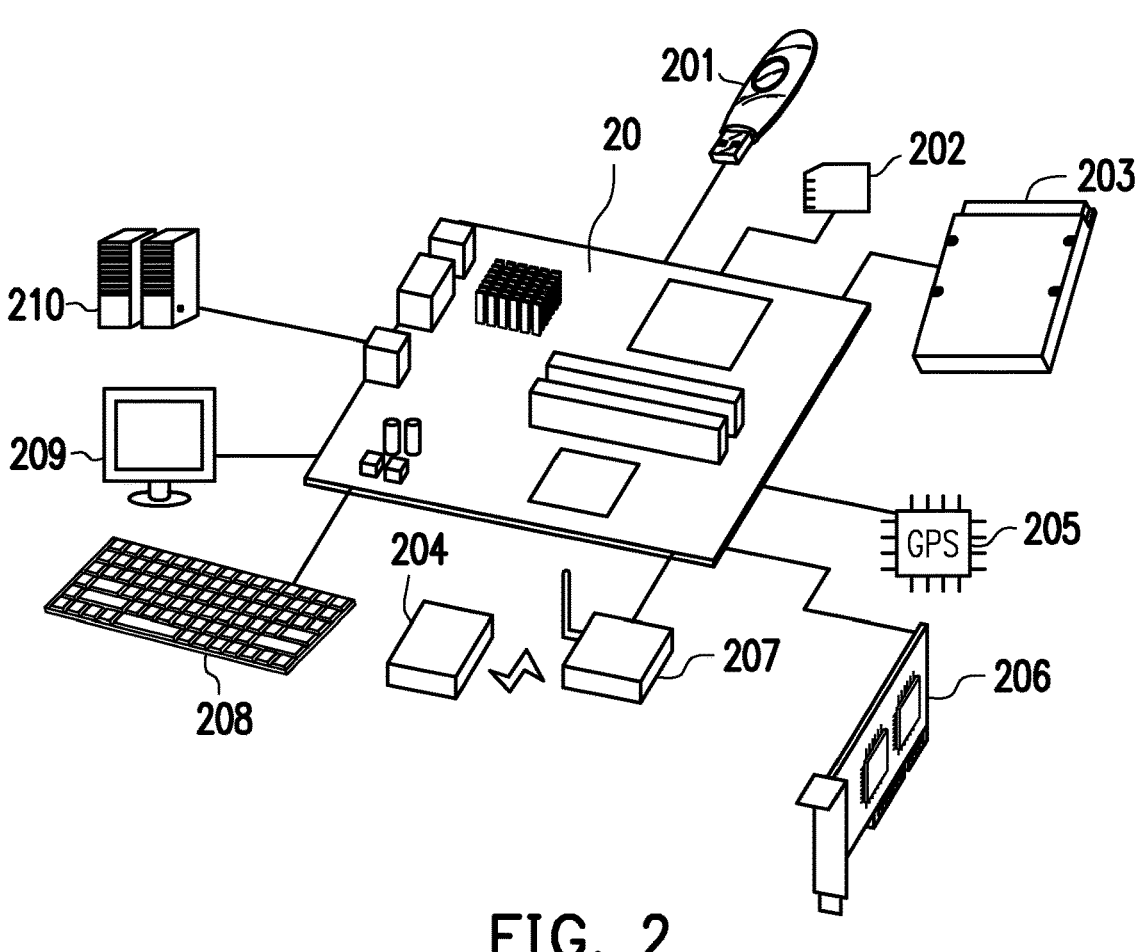
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Referring to FIG. 1 and FIG. 2, a host system 11 may include a processor 111, a random access memory (RAM) 112, a read only memory (ROM) 113, and a data transmission interface 114. The processor 111, the random access memory 112, the read only memory 113, and the data transmission interface 114 may be coupled to a system bus 110.

In an exemplary embodiment, the host system 11 may be coupled to a memory storage device 10 through the data transfer interface 114. For example, the host system 11 may store data to or read data from the memory storage device 10 via the data transmission interface 114. In addition, the host system 11 may be coupled to an I/O device 12 through the system bus 110. For example, the host system 11 may transmit output signals to or receive input signals from the I/O device 12 via the system bus 110.

In an exemplary embodiment, the processor 111, the random access memory 112, the read only memory 113, and the data transmission interface 114 may be disposed on a motherboard 20 of the host system 11. The number of the data transmission interface 114 may be one or more. The motherboard 20 may be coupled to the memory storage device 10 through the data transmission interface 114 via a wired or wireless connection.

In an exemplary embodiment, the memory storage device 10 may be, for example, a flash drive 201, a memory card 202, a solid state drive (SSD) 203, or a wireless memory storage device 204. The wireless memory storage device 204 may be a memory storage device based on various wireless communication technologies, such as a near field communication (NFC) memory storage device, a wireless fax (WiFi) memory storage device, a Bluetooth memory storage device, a low power Bluetooth memory storage device (e.g. iBeacon), etc. In addition, the motherboard 20 may also be coupled to various I/O devices, such as a global positioning system (GPS) module 205, a network interface card 206, a wireless transmission device 207, a keyboard 208, a screen 209, a speaker 210, etc., through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with a memory storage device to store data. In an exemplary embodiment, the memory storage device 10 and the host system 11 may respectively include the memory storage device 30 and the host system 31 of FIG. 3.

Figure 3:
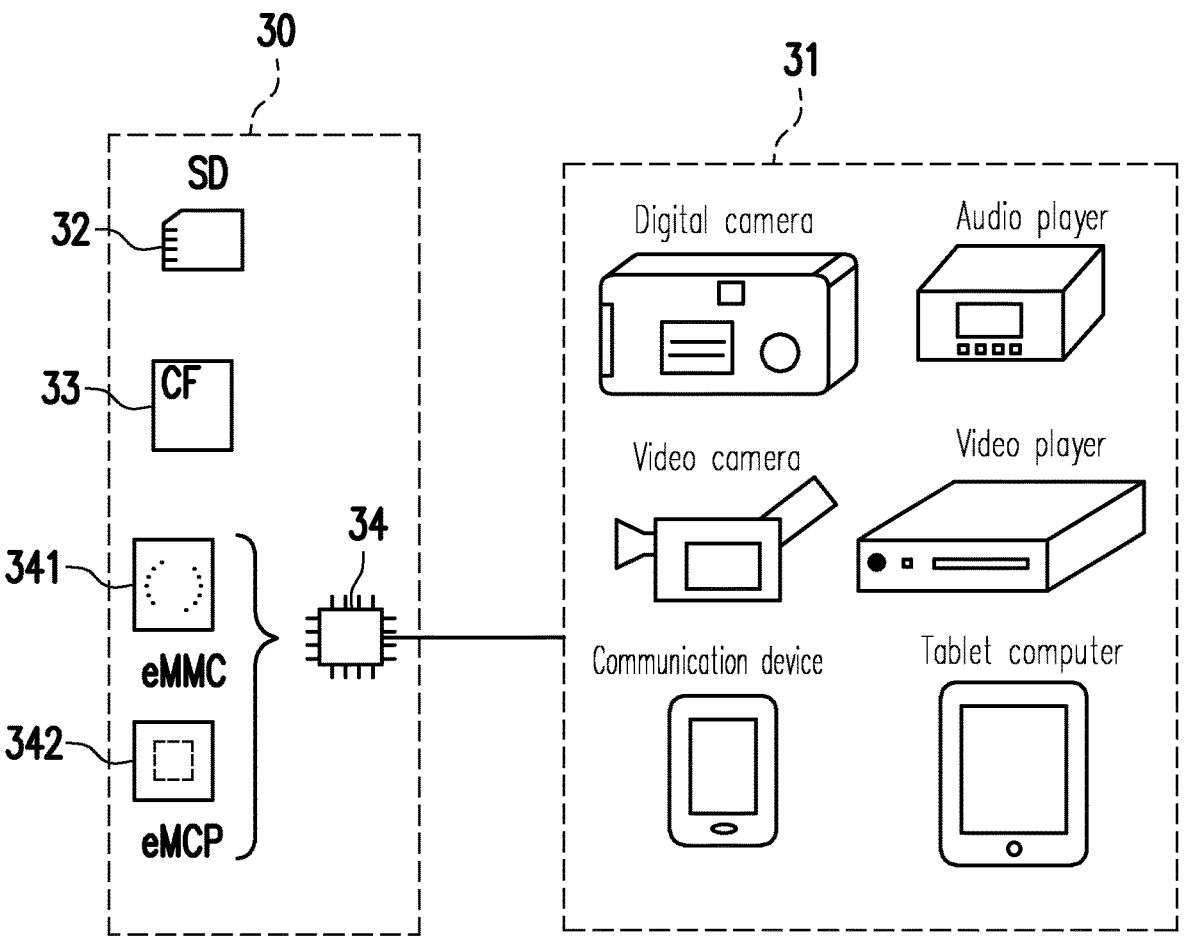
FIG. 3 is a schematic diagram of a host system and a memory storage device according to an exemplary embodiment of the disclosure.

FIG. 3 is a schematic diagram of a host system and a memory storage device according to an exemplary embodiment of the disclosure. Referring to FIG. 3, the memory storage device 30 may be used in conjunction with the host system 31 to store data. For example, the host system 31 may be a system such a digital camera, a video camera, a communication device, an audio player, a video player, or a tablet, etc. For example, the memory storage device 30 may be various non-volatile memory storage devices, such as a secure digital (SD) card 32, a compact flash (CF) card 33, or an embedded storage device 34, etc., used in the host system 31. The embedded storage device 34 includes various embedded storage devices that directly couple a memory module to a substrate of the host system, such as an embedded multimedia card (eMMC) 341 and/or an embedded multi-chip package (eMCP) storage device 342, etc.

Figure 4:
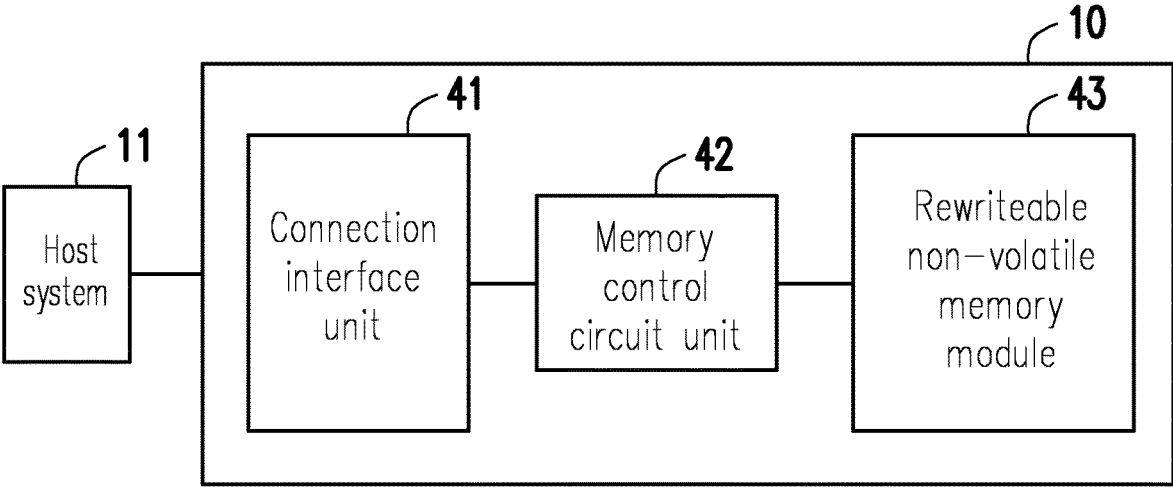
FIG. 4 is a schematic block diagram of a memory storage device according to an exemplary embodiment of the disclosure.

FIG. 4 is a schematic diagram of a memory storage device according to an exemplary embodiment of the disclosure. Referring to FIG. 4, the memory storage device 10 includes a connection interface unit 41, a memory control circuit unit 42, and a rewritable non-volatile memory module 43.

The connection interface unit 41 is used for coupling the memory storage device 10 to the host system 11. The memory storage device 10 may communicate with the host system 11 via the connection interface unit 41. In an exemplary embodiment, the connection interface unit 41 is compatible with the peripheral component interconnect express (PCI Express) standard. In an exemplary embodiment, the connection interface unit 41 may also be compliant to the serial advanced technology attachment (SATA) standard, the parallel advanced technology attachment (PATA) standard, the institute of electrical and electronics engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 may be packaged in a chip with the memory control circuit unit 42, or the connection interface unit 41 may be disposed outside a chip including the memory control circuit unit 42.

The memory control circuit unit 42 is coupled to the connection interface unit 41 and the rewritable non-volatile memory module 43. The memory control circuit unit 42 is used to execute multiple logic gates or control commands implemented in a hardware form or a firmware form and to perform operations such as writing, reading, and erasing of data in the rewritable non-volatile memory module 43 according to the commands of the host system 11.

The rewritable non-volatile memory module 43 is used to store the data written by the host system 11. The rewritable non-volatile memory module 43 may include a single level cell (SLC) NAND-type flash memory module (i.e., a flash memory that may store 1 bit in one memory cell), multi-level cell (MLC) NAND-type flash memory module (i.e., a flash memory module that may store 2 bits in one memory cell), a triple level cell (TLC) NAND-type flash memory module (i.e., a flash memory module that may store 3 bits in one memory cell), a quad level cell (QLC) NAND-type flash memory module (i.e., a flash memory module that may store 4 bits in one memory cell), other flash memory modules, or other memory modules with the same characteristics.

Each memory cell in the rewritable non-volatile memory module 43 stores one or more bits by a change in a voltage (also referred to as a threshold voltage hereinafter). Specifically, there is a charge trapping layer between a control gate and a channel of each of the memory cells. By applying a write voltage to the control gate, the amount of electrons in the charge trapping layer may be changed, thereby changing the threshold voltage of the memory cell. This operation of changing the threshold voltage of the memory cell is also referred to as "writing data to the memory cell" or "programming the memory cell". As the threshold voltage changes, each of the memory cells in the rewritable non-volatile memory module 43 has multiple storage statuses. By applying a read voltage, it is possible to determine which storage status a memory cell belongs to, thereby obtaining the one or more bits stored in the memory cell.

In an exemplary embodiment, the memory cells of the rewritable non-volatile memory module 43 may constitute multiple physical programming units, and the physical programming units may constitute multiple physical erasing units. Specifically, memory cells on the same word line may form one or more physical programming units. If each memory cell may store two or more bits, the physical programming units on the same word line may be classified at least as lower physical programming units and upper physical programming units. For example, the least significant bit (LSB) of a memory cell belongs to a lower physical programming unit, and the most significant bit (MSB) of a memory cell belongs to an upper physical programming unit. Generally, in an MLC NAND flash memory, the write speed of the lower physical programming unit is greater than the write speed of the upper physical programming unit, and/or the reliability of the lower physical programming unit is higher than the reliability of the upper physical programming unit.

In the present exemplary embodiment, the physical programming unit is the minimum unit for programming. That is, the physical programming unit is the minimum unit for write data. For example, the physical programming unit may be a physical page or a physical sector. If the physical programming unit is a physical page, then the physical programming unit may include a data bit area and a redundancy bit area. The data bit area includes multiple physical sectors is used for storing user data, and the redundant bit area is used for storing system data (e.g., management data such as error correction codes). In an exemplary embodi-ment, the data bit area includes 32 physical sectors, and the size of a physical sector is 512 bytes (B). However, in other exemplary embodiments, the data bit area may also include 8, 16, or a greater or lesser number of physical sectors, and the size of each of the physical sectors may also be larger or smaller. On the other hand, the physical erasing unit is the minimum unit for erasing. That is, each of the physical erasing units includes the smallest number of memory cells to be erased together. For example, the physical erasing unit is a physical block.

Figure 5:
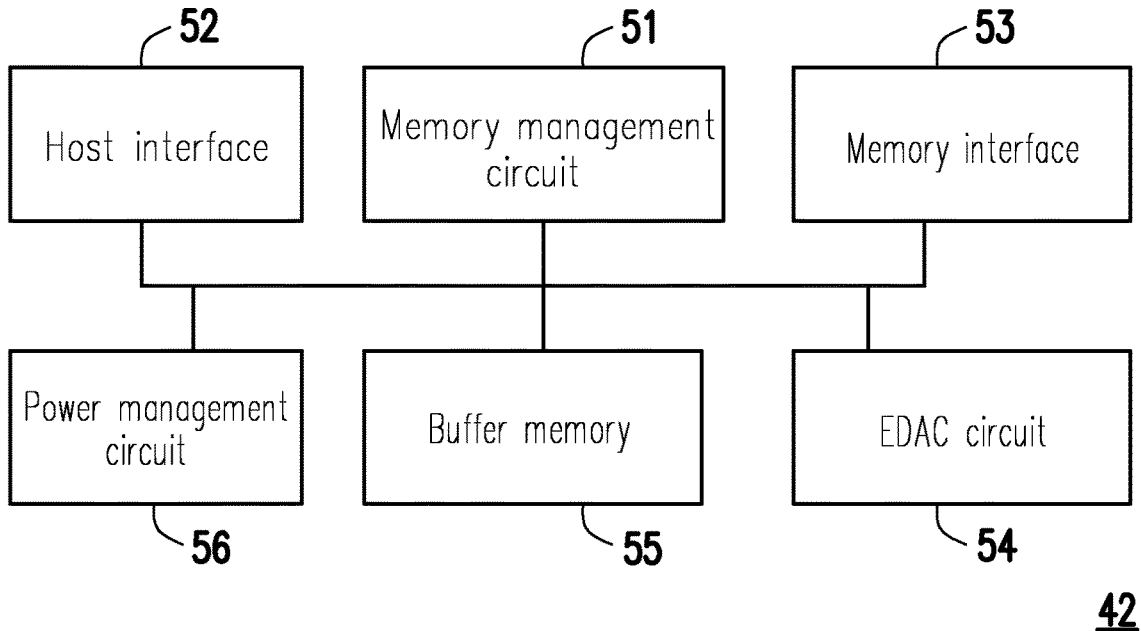
FIG. 5 is a schematic block diagram of a memory control circuit unit according to an exemplary embodiment of the disclosure.

FIG. 5 is a schematic diagram of a memory control circuit unit according to an exemplary embodiment of the disclosure. Referring to FIG. 5, the memory control circuit unit 42 includes a memory management circuit 51, a host interface 52, and a memory interface 53.

The memory management circuit 51 is used to control the overall operation of the memory control circuit unit 42. Specifically, the memory management circuit 51 has multiple control commands, and when the memory storage device 10 operates, the control commands are executed to perform operations such as writing, reading, and erasing data. The following description of the operation of the memory management circuit 51 is equivalent to the description of the operation of the memory control circuit unit 42.

In an exemplary embodiment, the control commands of the memory management circuit 51 are implemented in a firmware form. For example, the memory management circuit 51 has a microprocessor unit (not shown) and a read only memory (not shown), and the control commands are programmed into the read only memory. When the memory storage device 10 operates, the control commands are executed by the microprocessor unit to perform operations such as writing, reading, and erasing data.

In an exemplary embodiment, the control commands of the memory management circuit 51 may also be stored in a specific area of the rewritable non-volatile memory module 43 (for example, a system area dedicated to storing system data in the memory module) in a program code form. In addition, the memory management circuit 51 has a micro-processor unit (not shown), a read only memory (not shown), and a random access memory (not shown). In particular, the read only memory has a boot code, and when the memory control circuit unit 42 is enabled, the micro-processor unit first executes the boot code to load the control commands stored in the rewritable non-volatile memory module 43 into the random access memory of the memory management circuit 51. Thereafter, the microprocessor unit runs these control commands to perform operations such as writing, reading, and erasing data.

In an exemplary embodiment, the control commands of the memory management circuit 51 may also be implemented in a hardware form. For example, the memory management circuit 51 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell man-agement circuit is used to manage the memory cells or a memory cell group of the rewritable non-volatile memory module 43. The memory writing circuit is used to issue a write command sequence to the rewritable non-volatile memory module 43 to write data into the rewritable non-volatile memory module 43. The memory reading circuit is used to issue a read command sequence to the rewritable non-volatile memory module 43 to read data from the rewritable non-volatile memory module 43. The memory erasing circuit is used to issue an erase command sequence to the rewritable non-volatile memory module 43 to erase data from the rewritable non-volatile memory module 43. The data processing circuit is used to process the data to be written into the rewritable non-volatile memory module 43 and the data read from the rewritable non-volatile memory module 43. The write command sequence, the read command sequence and the erase command sequence may respectively include one or more program codes or command codes for instructing the rewritable non-volatile memory module 43 to perform corresponding writing, reading, and erasing operations. In an exemplary embodiment, the memory management circuit 51 may also issue other types of command sequences to the rewritable non-volatile memory module 43 to instruct the rewritable non-volatile memory module 43 to perform corresponding operations.

The host interface 52 is coupled to the memory management circuit 51. The memory management circuit 51 may communicate with the host system 11 through the host interface 52. The host interface 52 may be used to receive and identify the commands and data transmitted by the host system 11. For example, the commands and data transmitted by the host system 11 may be transmitted to the memory management circuit 51 through the host interface 52. In addition, the memory management circuit 51 may transmit data to the host system 11 through the host interface 52. In this exemplary embodiment, the host interface 52 is compatible with the PCI Express standard. However, it should be understood that the disclosure is not limited thereto, and the host interface 52 may also be compatible with the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 53 is coupled to the memory management circuit 51 and is used to access the rewritable non-volatile memory module 43. For example, the memory management circuit 51 may access the rewritable non-volatile memory module 43 through the memory interface 53. In other words, the data to be written into the rewritable non-volatile memory module 43 is converted into a format acceptable to the rewritable non-volatile memory module 43 via the memory interface 53. Specifically, if the memory management circuit 51 is to access the rewritable non-volatile memory module 43, the memory interface 53 transmits a corresponding command sequence. For example, the command sequences may include a write command sequence to instruct data writing, a read command sequence to instruct data reading, an erase command sequence to instruct data erasing, and corresponding command sequences for instructing various memory operations (e.g., changing the read voltage level, executing a garbage collection (GC) operation, etc.). These command sequences are, for example, generated by the memory management circuit 51 and transmitted to the rewritable non-volatile memory module 43 via the memory interface 53. These command sequences may include one or more signals or data on the bus. The signals or data may include command codes or program codes. For example, the read command sequence includes information such as the read identification code, the memory address, etc.

In an exemplary embodiment, the memory control circuit unit 42 further includes an error detecting and correcting circuit 54, a buffer memory 55, and a power management circuit 56.

The error detecting and correcting circuit 54 is coupled to the memory management circuit 51 and is configured to execute an error detecting and correcting operation to ensure the correctness of the data. Specifically, when the memory management circuit 51 receives a write command from the host system 11, the error detecting and correcting circuit 54 generates a corresponding error correcting code (ECC) and/or error detecting code (EDC) for the data corresponding to the write command, and the memory management circuit 51 writes the data corresponding to the write command and the corresponding error correcting code and/or error detecting code to the rewritable non-volatile memory module 43. Thereafter, when the memory management circuit 51 reads data from the rewritable non-volatile memory module 43, it simultaneously reads the error correcting code and/or the error detecting code corresponding to the data, and the error detecting and correcting circuit 54 executes the error detecting and correcting operation on the read data according to the error correcting code and/or error detecting code.

The buffer memory 55 is coupled to the memory management circuit 51 and used to temporarily store data. The power management circuit 56 is coupled to the memory management circuit 51 and used to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
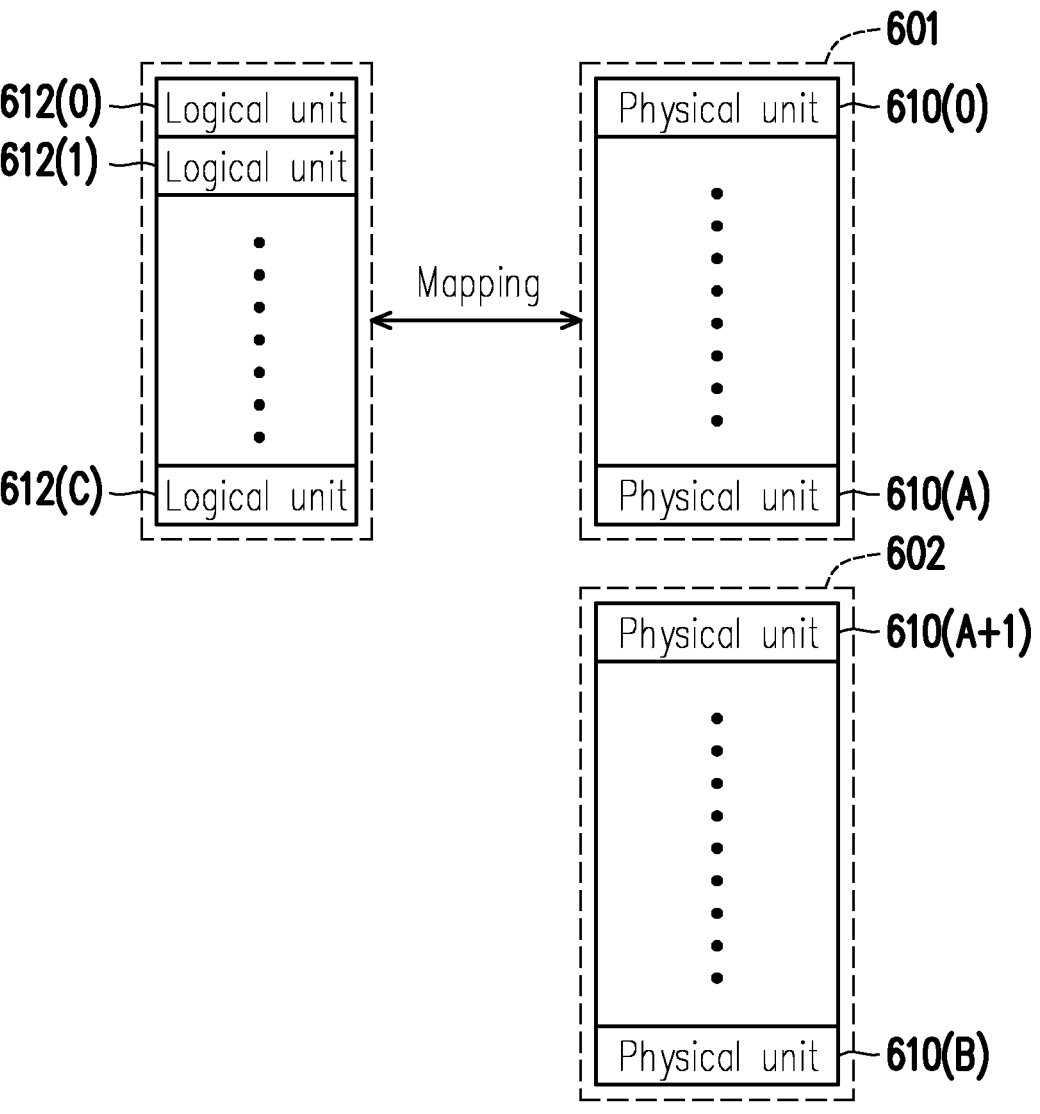
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure. Referring to FIG. 6, the memory management circuit 51 may logically group the physical units 610(0) to 610(B) in the rewritable non-volatile memory module 43 into a storage area 601 and a spare area 602.

In an exemplary embodiment, a physical unit refers to a physical address or a physical programming unit. In an exemplary embodiment, a physical unit may also be formed by multiple consecutive or non-consecutive physical addresses. In an exemplary embodiment, a physical unit may also refer to a virtual block (VB). A virtual block may include multiple physical addresses or multiple physical programming units. In an exemplary embodiment, a virtual block includes one or more physical erasing units.

The physical units 610(0) to 610(A) in the storage area 601 are used to store user data (e.g., user data from the host system 11 of FIG. 1). For example, the physical units 610(0) to 610(A) in the storage area 601 may store valid data and invalid data. The physical units 610(A+1) to 610(B) in the spare area 602 do not store data (e.g., valid data). For example, if a certain physical unit does not store valid data, this physical unit may be associated (or added) to the spare area 602. In addition, the physical units in the spare area 602 (or the physical units not storing valid data) may be erased. When new data is written, one or more physical units may be extracted from the spare area 602 to store the new data. In an exemplary embodiment, the spare area 602 is also referred to as a free pool.

The logic units 612(0) to 612(C) may be configured in the memory management circuit 51 to map the physical units 610(0) to 610(A) in the storage area 601. In an exemplary embodiment, each of the logic units corresponds to a logical address. For example, a logical address may include one or more logical block addresses (LBA) or other logical management units. In an exemplary embodiment, a logic unit may also correspond to a logical programming unit or be formed by multiple consecutive or non-consecutive logical addresses.

It should be noted that a logic unit may be mapped to one or more physical units. If a certain physical unit is currently mapped by a certain logic unit, it means that the data currently stored in this physical unit includes valid data. On the contrary, if a certain physical unit is not currently mapped by any logic unit, it means that the data currently stored in this physical unit is invalid data.

The memory management circuit 51 may record the management data (also referred to as the logical to physical mapping information) describing the mapping relationship between logic units and physical units in at least one logical to physical mapping table. When the host system 11 reads data from the memory storage device 10 or writes data to the memory storage device 10, the memory management circuit 51 may access the rewritable non-volatile memory module 43 according to the information in the logical to physical mapping table.

In an exemplary embodiment, the error detecting and correcting circuit 54 may include one or more decoding circuits. The decoding circuit may be configured to decode a data read from the rewritable non-volatile memory module 43. For example, the decoding circuit may attempt to correct some or all erroneous bits in data read from aging and/or damaged memory cells. For example, in an exemplary embodiment, the error detecting and correcting circuit 54 may use a low-density parity-check code (LDPC code) to encode and decode data. However, in another exemplary embodiment, the error detecting and correcting circuit 54 may also support BCH code, convolutional code, turbo code, etc., which is not limited in the disclosure. It should be noted that under certain circumstances (e.g., the threshold voltage of a memory cell shifts too much), the decoding capability (e.g., the decoding success rate) and/or the decoding speed of the decoding circuit may be reduced.

In an exemplary embodiment, after reading data from a certain physical unit of the rewritable non-volatile memory module 43, the error detecting and correcting circuit 54 may decode the read data based on a certain decoding mode (also referred to as a first decoding mode). After determining that the first decoding mode cannot successfully decode the data, the error detecting and correcting circuit 54 may decode the read data based on another decoding mode (also referred to as a second decoding mode). In an exemplary embodiment, the first decoding mode is also referred to as a hard decoding mode or a retry mode, and the second decoding mode is also referred to as a soft decoding mode.

In an exemplary embodiment, in the first decoding mode, the memory management circuit 51 may send at least one read command sequence to the rewritable non-volatile memory module 43. The read command sequence may instruct the rewritable non-volatile memory module 43 to use a certain read voltage level (also referred to as a hard decision voltage level) to read the memory cells in a certain physical unit. The error detecting and correcting circuit 54 may then decode the read data based on the first decoding mode. If the decoding is successful, the successfully decoded data may be output. If the decoding fails, the memory management circuit 51 may adjust the read voltage level and instruct the rewritable non-volatile memory module 43 to use the adjusted read voltage level to read the physical unit again. The error detecting and correcting circuit 54 may then decode the read data again. The memory management circuit 51 and the error detecting and correcting circuit 54 may repeat the above operations until decoding is successful or a retry count reaches a retry threshold. The retry count reflects a cumulative number of decoding. For example, in the first decoding mode, each time the read voltage level is adjusted, the retry count may be updated (e.g., incremented by 1). If the retry count reaches the retry threshold, the memory management circuit 51 may instruct the error detecting and correcting circuit 54 to enter the second decoding mode. For example, assuming that the retry threshold is 60, the retry count may be updated to 60 after the same physical cell is read using 60 (or 60 groups of) different read voltage levels continuously. At this time, the retry count is equal to the retry threshold, and the error detecting and correcting circuit 54 may enter the second decoding mode.

In an exemplary embodiment, in the second decoding mode, the memory management circuit 51 may send at least one read command sequence to the rewritable non-volatile memory module 43. The read command sequence may instruct the rewritable non-volatile memory module 43 to use multiple read voltage levels (also referred to as soft decision voltage levels) to read the memory cells in a certain physical unit. It should be noted that in the second decoding mode, multiple read voltage levels may be used to read a single memory cell to obtain multiple bits (also referred to as verification bits). One of these verification bits is also referred to as a hard bit, and the remaining bits are also referred to as soft bits. For example, assuming that 5 read voltage levels are used to continuously read a certain memory cell to obtain 5 verification bits, these 5 verification bits may include 1 hard bit and 4 soft bits. In an exemplary embodiment, these 4 soft bits may also be reduced to 2 or other numbers of soft bits by performing logical operations. In addition, the disclosure does not limit the number of read voltage levels used to read a certain memory cell, the number of hard bits read from a certain memory cell, and/or the number of soft bits read from a certain memory cell in the second decoding mode. The error detecting and correcting circuit 54 may then decode the read data based on the second decoding mode.

Generally speaking, due to the use of soft bits (or other types of auxiliary decoding information), the decoding success rate of the decoding operation performed based on the second decoding mode may be higher than the decoding success rate of the decoding operation performed based on the first decoding mode. However, the decoding time required for the decoding operation performed based on the second decoding mode is also significantly higher than the decoding time required for the decoding operation performed based on the first decoding mode.

In an exemplary embodiment, in the second decoding mode, the memory management circuit 51 may update the reliability information according to the soft bits. For example, compared to the preset reliability information, the updated reliability information may be more consistent with the aging and/or damaged status of the current memory cell. The error detecting and correcting circuit 54 has a higher probability of successfully decoding the read data according to the updated reliability information.

In an exemplary embodiment, the reliability information may include a log likelihood ratio (LLR). The log likelihood ratio may reflect the probability that the data read from a certain memory cell is a bit "0" and/or a bit "1". In an exemplary embodiment, reliability information may be obtained from look-up tables. For example, at least one reliability information table provided by the supplier of the memory module may be stored in the rewritable non-volatile memory module 43. The memory management circuit 51 may query the reliability information table according to the obtained soft bits to obtain the reliability information used for decoding. In an exemplary embodiment, reliability information may also be obtained through real-time calculations. For example, the memory management circuit 51 may estimate the total number of memory cells whose threshold voltages fall within a certain voltage range according to the obtained soft bits. The memory management circuit 502 may dynamically calculate the reliability information corresponding to these memory cells according to the total number. In an exemplary embodiment, the reliability information dynamically obtained according to the total number may be more consistent with the aging and/or damaged status of the current memory cell. Therefore, the decoding success rate of the error detecting and correcting circuit 54 may be improved by using the dynamically obtained reliability information.

In an exemplary embodiment, the memory management circuit 51 may instruct the rewritable non-volatile memory module 43 to perform a data refresh operation. This data refreshing operation may be configured to reduce the bit error rate of at least part of the data stored in the rewritable non-volatile memory module 43. For example, this data refresh operation may be configured to update data in the rewritable non-volatile memory module 43 to reduce the bit error rate of the data.

Figure 7:
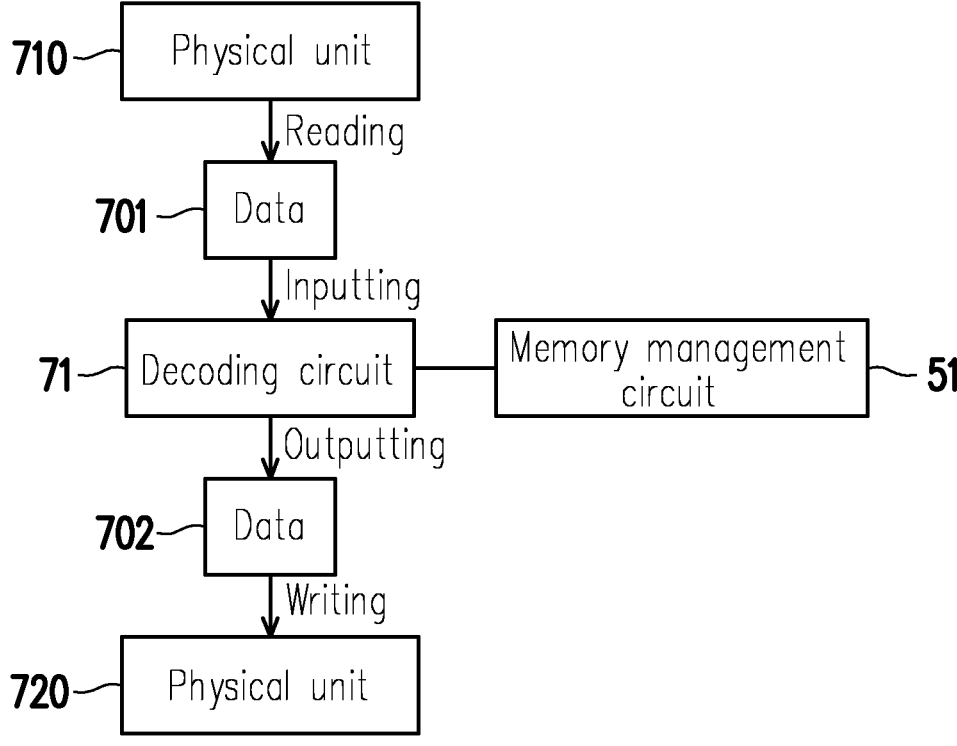
FIG. 7 is a schematic diagram of a data refresh operation according to an exemplary embodiment of the disclosure.

FIG. 7 is a schematic diagram of a data refresh operation according to an exemplary embodiment of the disclosure. Referring to FIG. 7, in an exemplary embodiment, during a data refresh operation, the memory management circuit 51 may instruct the rewritable non-volatile memory module 43 to read data 701 from the physical unit 710. For example, the physical unit 710 may be at least one of the physical units 610(0) to 610(A) in FIG. 6. The data 701 may include valid data stored in the physical unit 710. The decoding circuit 71 may then decode the data 701 to correct errors in the data 701. For example, the decoding circuit 71 may be included in the error detecting and correcting circuit 54 of FIG. 5. After successfully decoding the data 701 (e.g., successfully correcting all errors in the data 701), the decoding circuit 71 may output the data 702 (i.e., the successfully decoded data 701). Then, the memory management circuit 51 may instruct the rewritable non-volatile memory module 43 to store the data 702 to the physical unit 720. For example, the physical unit 720 may be at least one of the physical units 610(A+1) to 610(B) in FIG. 6.

In an exemplary embodiment, it is assumed that the bit error rate of the data 701 originally read from the physical unit 710 is E(1), and the data 701 belongs to the logic unit 612(0) of FIG. 6. After decoding the data 701 and generating the data 702, the bit error rate of the data 702 may be reduced to E(2), and E(2) is smaller than E(1). The data 702 also belongs to logic unit 612(0) and may be configured to replace the data 701. In an exemplary embodiment, updating the data 701 to the data 702 through a data refresh operation and re-storing the data 702 into the physical unit 720 may effectively reduce the bit error rate of the data belonging to the logic unit 612(0).

In an exemplary embodiment, the memory management circuit 51 may detect the status of the rewritable non-volatile memory module 43. For example, this status may reflect the degree of loss and/or data access performance of at least some of the physical cells in the rewritable non-volatile memory module 43. Then, the memory management circuit 51 may determine whether to perform a data refresh operation on the rewritable non-volatile memory module 43 according to multiple conditions.

In an exemplary embodiment, in a certain status of the rewritable non-volatile memory module 43 (also referred to as the first status), the memory management circuit 51 may determine to perform a data refresh operation on the rewritable non-volatile memory module 43 according to the multiple conditions. For example, when the memory management circuit 51 determines to perform a data refresh operation on the rewritable non-volatile memory module 43, the memory management circuit 51 may allow (including instruct) the rewritable non-volatile memory module 43 to perform a data refresh operation on one or more physical units in the rewritable non-volatile memory module 43.

In an exemplary embodiment, in another status of the rewritable non-volatile memory module 43 (also referred to as the second status), the memory management circuit 51 may determine to not perform a data refresh operation on the rewritable non-volatile memory module 43 according to the multiple conditions. For example, when the memory management circuit 51 determines to not perform a data refresh operation on the rewritable non-volatile memory module 43, the memory management circuit 51 may not allow (including suspend, delay, or prohibit) data refresh operations on one or more physical units in the rewritable non-volatile memory module 43.

In an exemplary embodiment, the conditions may include a first condition and a second condition. The first condition is related to a single physical unit (also referred to as the first physical unit) in the rewritable non-volatile memory module 43. The second condition is related to multiple physical units (also referred to as second physical units) in the rewritable non-volatile memory module 43. In an exemplary embodiment, the first condition may reflect the electrical performance of the first physical unit, and/or the second condition may reflect the electrical performance of the second physical units.

In an exemplary embodiment, any physical unit in the rewritable non-volatile memory module 43 may be regarded as a first physical unit or a second physical unit. In an exemplary embodiment, the second physical unit may include the first physical unit. In an exemplary embodiment, the second physical unit may not include the first physical unit.

In an exemplary embodiment, the first condition includes whether the first physical unit meets a threshold condition (also referred to as the first threshold condition). That is, in an exemplary embodiment, the memory management circuit 51 may determine whether to perform a data refresh operation on the rewritable non-volatile memory module 43 according to whether the first physical unit meets the first threshold condition (i.e., the first condition) and the second condition.

In an exemplary embodiment, the memory management circuit 51 may determine whether the first physical unit meets the first threshold condition according to the degree of loss of the first physical unit. The degree of loss of the first physical unit is related to the bit error rate of the data (also referred to the first data) stored in the first physical unit. For example, the degree of loss of the first physical unit may be positively related to the bit error rate of the first data. That is, if the degree of loss of the first physical unit is higher, the bit error rate of the first data is likely to be higher.

In an exemplary embodiment, the memory management circuit 51 may send a read command sequence to the rewritable non-volatile memory module 43 to instruct the rewritable non-volatile memory module 43 to read data (i.e., the first data) from the first physical unit. After reading the first data from the first physical unit, the error detecting and correcting circuit 54 may decode the first data. For example, the error detecting and correcting circuit 54 may decode the first data in a hard decoding mode or a soft decoding mode.

In an exemplary embodiment, the memory management circuit 51 may evaluate the degree of loss of the first physical unit according to whether the first data is decoded in the soft decoding mode during the process of decoding the first data. In an exemplary embodiment, assuming that during the process of decoding the first data, the first data is decoded in the soft decoding mode (i.e., the error detecting and correcting circuit 54 enters the soft decoding mode to decode the first data), indicating that the bit error rate of the first data is relatively high (and the degree of loss of the first physical unit is relatively high), then the memory management circuit 51 may determine that the first physical unit meets the first threshold condition. Alternatively, in an exemplary embodiment, assuming that during the process of decoding the first data, the first data is not decoded in the soft decoding mode (i.e., the error detecting and correcting circuit 54 does not enter the soft decoding mode to decode the first data), indicating that the bit error rate of the first data is relatively low (and the degree of loss of the first physical unit is relatively low), then the memory management circuit 51 may determine that the first physical unit does not meet the first threshold condition.

In an exemplary embodiment, the memory management circuit 51 may also determine whether the first physical unit meets the first threshold condition according to a loss evaluation value (also referred to as a first loss evaluation value). The first loss evaluation value may reflect the degree of loss of the first physical unit. For example, the first loss evaluation value may be positively related to the degree of loss of the first physical unit. That is, the greater the first loss evaluation value, the higher the degree of loss of the first physical unit.

In an exemplary embodiment, the memory management circuit 51 may determine the first loss evaluation value according to the program count, erase count, read count of the first physical unit and/or the bit error rate of the first data. The program count may reflect the number of times the first physical unit is programmed. The erase count may reflect the number of times the first physical unit is erased. The read count may reflect the number of times the first physical unit is read. For example, the first loss evaluation value may be positively related to the program count, erase count, read count of the first physical unit and/or the bit error rate of the first data. In addition, the memory management circuit 51 may also determine the first loss evaluation value according to the threshold voltage distribution of multiple memory cells in the first physical unit or other information related to the degree of loss of the first physical unit.

In an exemplary embodiment, the memory management circuit 51 may compare the first loss evaluation value with a threshold value (also referred to as the first threshold value) and determine whether the first physical unit meets the first threshold condition according to the comparison result. In an exemplary embodiment, if the comparison result reflects that the first loss evaluation value is greater than the first threshold value, indicating that the degree of loss of the first physical unit is relatively high, the memory management circuit 51 may determine that the first physical unit meets the first threshold condition. However, if the comparison result reflects that the first loss evaluation value is not greater than the first threshold value, indicating that the degree of loss of the first physical unit is relatively low, the memory management circuit 51 may determine that the first physical unit does not meet the first threshold condition.

In an exemplary embodiment, the above-mentioned multiple determination mechanisms for determining whether the first physical unit meets the first threshold condition may be used independently. For example, in an exemplary embodiment, the memory management circuit 51 may determine that the first physical unit meets the first threshold condition as long as the first data has been decoded in the soft decoding mode or the first loss evaluation value is greater than the first threshold value. Alternatively, in an exemplary embodiment, the above-mentioned multiple determination mechanisms for determining whether the first physical unit meets the first threshold condition may also be used together. For example, in an exemplary embodiment, the memory management circuit 51 may determine that the first physical unit meets the first threshold condition only after determining that the first data has been decoded in the soft decoding mode and the first loss evaluation value is greater than the first threshold value.

In an exemplary embodiment, the second condition includes whether the second physical units meet a threshold condition (also referred to as the second threshold condition). That is, in an exemplary embodiment, the memory management circuit 51 may determine whether to perform a data refresh operation on the rewritable non-volatile memory module 43 according to whether the second physical units meet the second threshold condition (i.e., the second condition) and the first condition.

In an exemplary embodiment, the memory management circuit 51 may determine whether the second physical units meet the second threshold condition according to at least one of the degree of loss and the data access performance of the second physical units. For example, the degree of loss of the second physical units may include an average degree of loss of the second physical units. For example, the data access performance of the second physical units may include an average data access performance of the second physical units.

In an exemplary embodiment, the memory management circuit 51 may determine whether the second physical units meet the second threshold condition according to a loss evaluation value (also referred to as a second loss evaluation value). The second loss evaluation value may reflect the degree of loss of the second physical units. For example, the second loss evaluation value may be positively related to the average loss degree of the second physical units. That is, the greater the second loss evaluation value, the higher the average degree of loss of the second physical units.

In an exemplary embodiment, the memory management circuit 51 may obtain the second loss evaluation value according to the respective loss evaluation values of the second physical units. For example, the loss evaluation value of a certain second physical unit may be determined according to the program count, erase count, read count of the second physical unit and/or the bit error rate of the data read from the second physical unit. The memory management circuit 51 may obtain the second loss evaluation value according to the average, weighted average, or median of the loss evaluation values of the second physical units.

In an exemplary embodiment, the memory management circuit 51 may compare the second loss evaluation value with a threshold value (also referred to as the second threshold value) and determine whether the second physical units meet the second threshold condition according to the comparison result. In an exemplary embodiment, if the comparison result reflects that the second loss evaluation value is greater than the second threshold value, indicating that the average degree of loss of the second physical units is relatively high, the memory management circuit 51 may determine that the second physical units meet the second threshold condition. However, if the comparison result reflects that the second loss evaluation value is not greater than the second threshold value, indicating that the average degree of loss of the second physical units is relatively low, the memory management circuit 51 may determine that the second physical units do not meet the second threshold condition.

In an exemplary embodiment, the memory management circuit 51 may also determine whether the second physical units meet the second threshold condition according to the total number of physical units (i.e., physical units with a relatively high degree of loss) among the second physical units that meet the first threshold condition. In an exemplary embodiment, assuming that within a past period of time (also referred to as a target time range), the total number of physical units that meet the first threshold condition among the second physical units is p. The memory management circuit 51 may determine whether the total number (i.e., p) is greater than a threshold value (also referred to as a third threshold value). In an exemplary embodiment, in response to the total number (i.e., p) being greater than the third threshold value, the memory management circuit 51 may determine that the second physical units meet the second threshold condition. However, if the total number is not greater than the third threshold value, the memory management circuit 51 may determine that the second physical units do not meet the second threshold condition.

In an exemplary embodiment, the total number of physical units among the second physical units that meet the first threshold condition may also be replaced by the proportion of physical units among the second physical units that meet the first threshold condition. For example, it is assumed that within the target time range, the proportion of the second physical units among the second entity units that meet the first threshold condition is k %, where k may be any value from 0 to 100. In an exemplary embodiment, the memory management circuit 51 may also determine whether k % is greater than a threshold value (also referred to a fourth threshold value). In an exemplary embodiment, in response to k % being greater than the fourth threshold value, the memory management circuit 51 may determine that the second physical units meet the second threshold condition. However, in an exemplary embodiment, if k % is not greater than the fourth threshold value, the memory management circuit 51 may determine that the second physical units do not meet the second threshold condition.

In an exemplary embodiment, it is assumed that the second physical units include multiple physical units read within a target time range, and the fourth threshold value is 50%. The memory management circuit 51 may determine whether the proportion (i.e., k %) of physical units that meet the first threshold condition among these physical units is greater than 50%. In response to the proportion (i.e., k %) of the physical units that meet the first threshold condition among these physical units being greater than 50%, the memory management circuit 51 may determine that the second physical units meet the second threshold condition. However, if the proportion (i.e., k %) of physical units that meet the first threshold condition among these physical units is not greater than 50%, the memory management circuit 51 may determine that the second physical units do not meet the second threshold condition.

In an exemplary embodiment, the memory management circuit 51 may also determine whether the second physical units meet the second threshold condition according to a performance evaluation value. The performance evaluation value may reflect the data access performance of the second physical units.

In an exemplary embodiment, the memory management circuit 51 may obtain the performance evaluation value according to the data transmission amount per unit time between the memory storage device 10 and the host system 11 within the target time range. In an exemplary embodiment, the data transmission amount per unit time may reflect the data reading speed of reading data from the second physical units within the target time range. In an exemplary embodiment, the data transmission amount per unit time may reflect the data writing speed of storing data into the second physical units within the target time range.

In an exemplary embodiment, the memory management circuit 51 may compare this performance evaluation value with a threshold value (also referred to as the fifth threshold value) and determine whether the second physical units meet the second threshold condition according to the comparison result. In an exemplary embodiment, if the comparison result reflects that this performance evaluation value is greater than the fifth threshold value, indicating that the data access performance of the second physical units is relatively high, the memory management circuit 51 may determine that the second physical units meet the second threshold condition. However, if the comparison result reflects that this performance evaluation value is not greater than the fifth threshold value, indicating that the data access performance of the second physical units is relatively low, the memory management circuit 51 may determine that the second physical units do not meet the second threshold condition.

In an exemplary embodiment, the above-mentioned multiple determination mechanisms for determining whether the second physical units meet the second threshold condition may be used independently. For example, in an exemplary embodiment, as long as the second loss evaluation value is greater than the second threshold value, the total number of physical units among the second physical units that meet the first threshold condition is greater than the third threshold value, the proportion of the second physical units among the second physical units that meet the first threshold condition is greater than the fourth threshold value, or the performance evaluation value is greater than the fifth threshold value, the memory management circuit 51 may determine that the second physical units meet the second threshold condition. Alternatively, in an exemplary embodiment, the above-mentioned multiple determination mechanisms for determining whether the first physical unit meets the first threshold condition may also be used at least partially together. For example, in an exemplary embodiment, only after at least two of the conditions where the second loss evaluation value is greater than the second threshold value, the total number of physical units among the second physical units that meet the first threshold condition is greater than the third threshold value, the proportion of the second physical units among the second physical units that meet the first threshold condition is greater than the fourth threshold value, or the performance evaluation value is greater than the fifth threshold value are established, the memory management circuit 51 may determine that the second physical units meet the second threshold condition.

In an exemplary embodiment, in response to the first physical unit meeting the first threshold condition (i.e., the first condition being met) and the second physical units meeting the second threshold condition (i.e., the second condition being met), the memory management circuit 51 may determine to perform a data refresh operation on the rewritable non-volatile memory module 43. For example, after determining to perform a data refresh operation on the rewritable non-volatile memory module 43, the memory management circuit 51 may instruct the rewritable non-volatile memory module 43 to perform a data refresh operation on the physical unit (also referred to as the third physical unit) in the rewritable non-volatile memory module 43 that meet the first threshold condition. The details of determining whether a physical unit meets the first threshold condition and performing a data refresh operation on the physical unit have been described in detail above and are not repeated herein.

In an exemplary embodiment, if there is no physical unit that meets the first threshold condition (i.e., the first physical unit does not meet the first threshold condition) in the rewritable non-volatile memory module 43 and/or the second physical units do not meet the second threshold condition, the memory management circuit 51 may determine not to perform a data refresh operation on the rewritable non-volatile memory module 43. It should be noted that when the memory management circuit 51 determines not to perform a data refresh operation on the rewritable non-volatile memory module 43, even if a certain physical unit (e.g., a third physical unit) in the rewritable non-volatile memory module 43 meets the first threshold condition, the memory management circuit 51 still does not allow the data refresh operation to be performed on the physical unit. Thereby, it is possible to avoid affecting the performance of the rewritable non-volatile memory module 43 due to a data refresh operation, thereby improving the operational stability of the memory storage device 10.

In an exemplary embodiment, the third physical unit does not include the detected first physical unit that meets the first threshold condition before determining to perform a data refresh operation on the rewritable non-volatile memory module 43. That is, before determining to perform a data refresh operation on the rewritable non-volatile memory module 43, the detected first physical unit that meets the first threshold condition may be ignored or skipped. After determining to perform a data refresh operation on the rewritable non-volatile memory module 43, the memory management circuit 51 does not perform a data refresh operation on the first physical unit that was previously ignored or skipped.

In an exemplary embodiment, the third physical unit may include the detected first physical unit that meets the first threshold condition before determining to perform a data refresh operation on the rewritable non-volatile memory module 43. That is, before determining to perform a data refresh operation on the rewritable non-volatile memory module 43, the detected first physical unit that meets the first threshold condition may be ignored or skipped. However, after determining to perform a data refresh operation on the rewritable non-volatile memory module 43, the memory management circuit 51 may perform a data refresh operation on the first physical unit that was previously ignored or skipped.

In an exemplary embodiment, after determining not to perform a data refresh operation on the rewritable non-volatile memory module 43, the memory management circuit 51 may reduce the job priority of the data refresh operation and/or increase the job priority of the host access operation. The host access operation refers to data reading, writing, and/or erasing access operation, etc., performed on the rewritable non-volatile memory module 43 according to the command from the host system 11 (e.g., read command, write command, or erase command from the host system 11).

In an exemplary embodiment, commands from the host system 11 (also referred to as host access commands) may be temporarily stored in the command buffer. When lowering the job priority of the data refresh operation and/or increasing the job priority of the host access operation, the host access command in the command buffer is executed first. After completing at least part or all of the host access commands in the command buffer, the remaining commands related to the data refresh operation in the command buffer may be executed.

Figure 8:
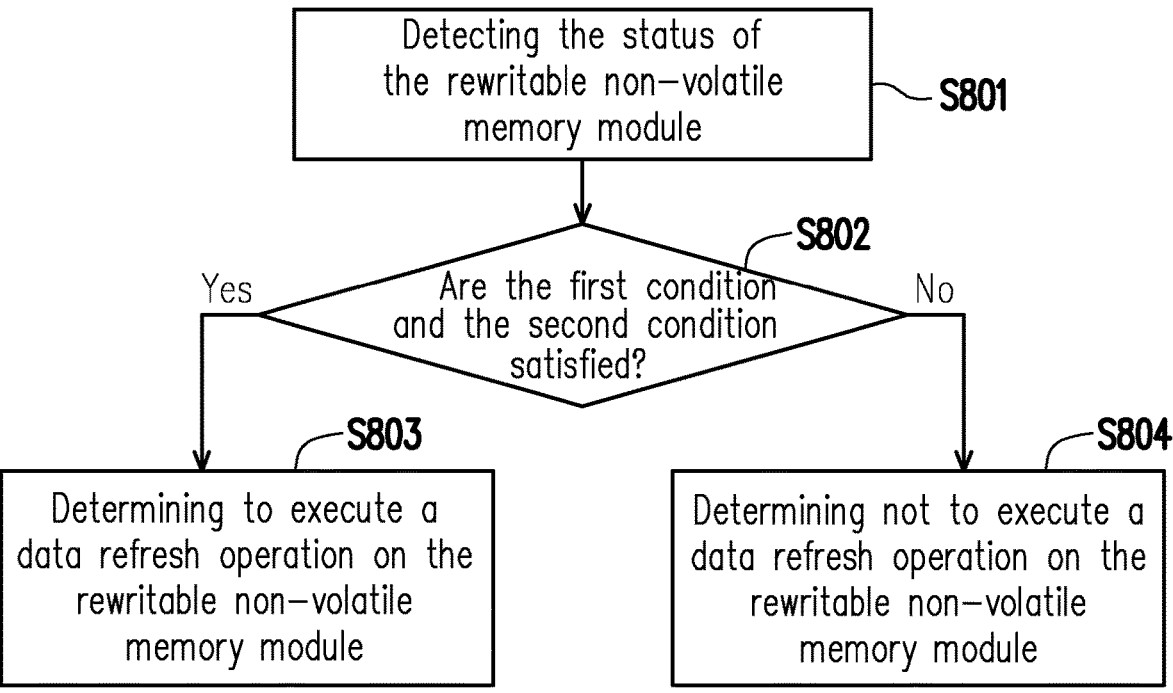
FIG. 8 is a flowchart of a memory management method according to an exemplary embodiment of the disclosure.

FIG. 8 is a flowchart of a memory management method according to an exemplary embodiment of the disclosure. Referring to FIG. 8, in step S801, the status of the rewritable non-volatile memory module is detected. In step S802, it is determined whether the first condition and the second condition are simultaneously satisfied. If the first condition and the second condition are simultaneously satisfied, in step S803, it is determined to perform a data refresh operation on the rewritable non-volatile memory module. However, if the first condition and the second condition are not simultaneously satisfied, in step S804, it is determined not to perform a data refresh operation on the rewritable non-volatile memory module.

Figure 9:
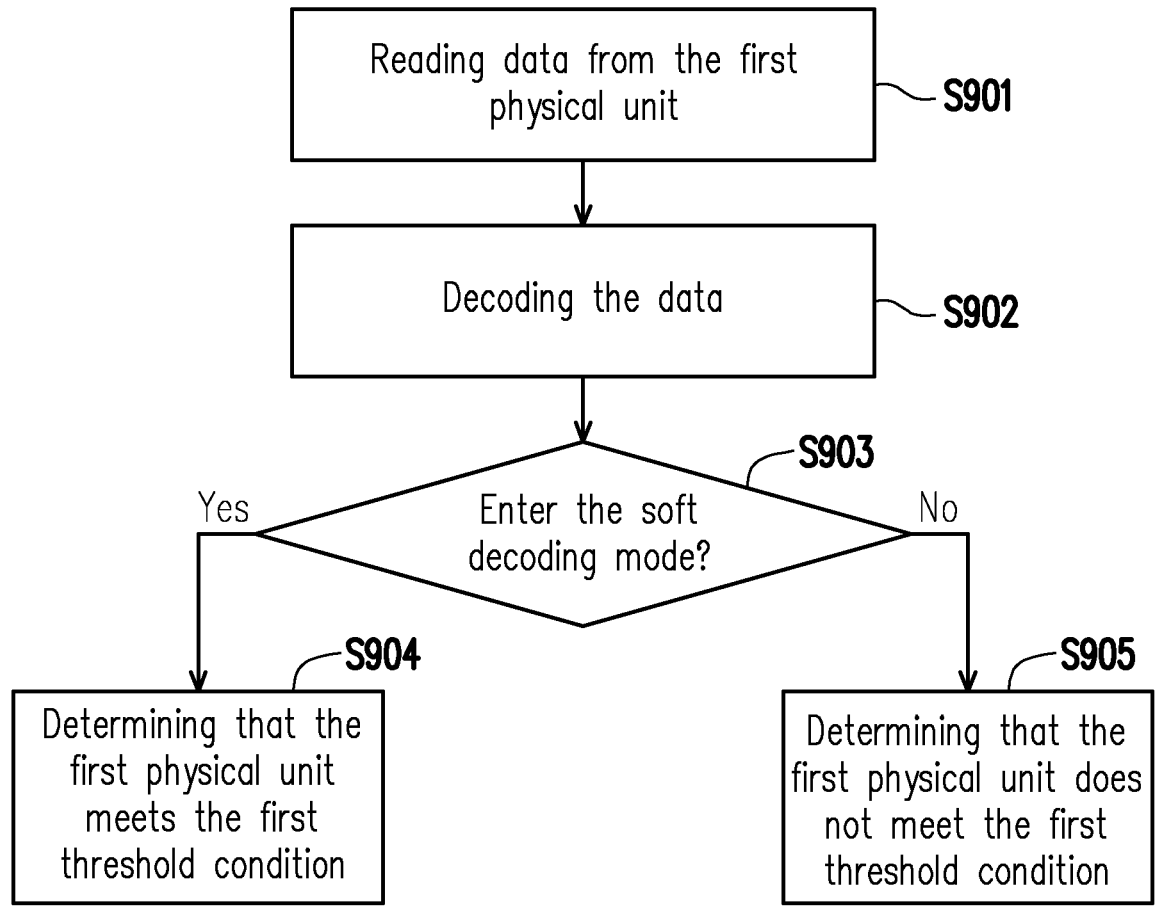
FIG. 9 is a flowchart of a memory management method according to an exemplary embodiment of the disclosure.

FIG. 9 is a flowchart of a memory management method according to an exemplary embodiment of the disclosure. Referring to FIG. 9, in step S901, data (i.e., the first data) is read from the first physical unit. In step S902, the data is decoded. In step S903, it is determined whether to enter the soft decoding mode to decode the data in the soft decoding mode. If the soft decoding mode is entered to decode the data in the soft decoding mode, in step S904, it is determined that the first physical unit meets the first threshold condition. However, if the soft decoding mode is not entered to decode the data in the soft decoding mode (e.g., the first data is only decoded in the hard decoding mode), in step S905, it is determined that the first physical unit does not meet the first threshold condition.

Figure 10:
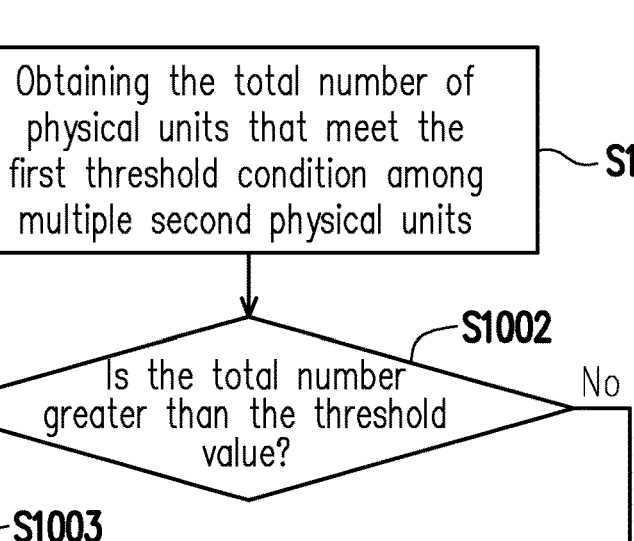
FIG. 10 is a flowchart of a memory management method according to an exemplary embodiment of the disclosure.

FIG. 10 is a flowchart of a memory management method according to an exemplary embodiment of the disclosure. Referring to FIG. 10, in step S1001, the total number of physical units that meet the first threshold condition among the second physical units is obtained. In step S1002, it is determined whether the total number is greater than a threshold value (i.e., the third threshold value). If the total number is greater than the threshold value, in step S1003, it is determined that the second physical units meet the second threshold condition. However, if the total number is not greater than the threshold value, in step S1004, it is determined that the second physical units do not meet the second threshold condition.

Figure 11:
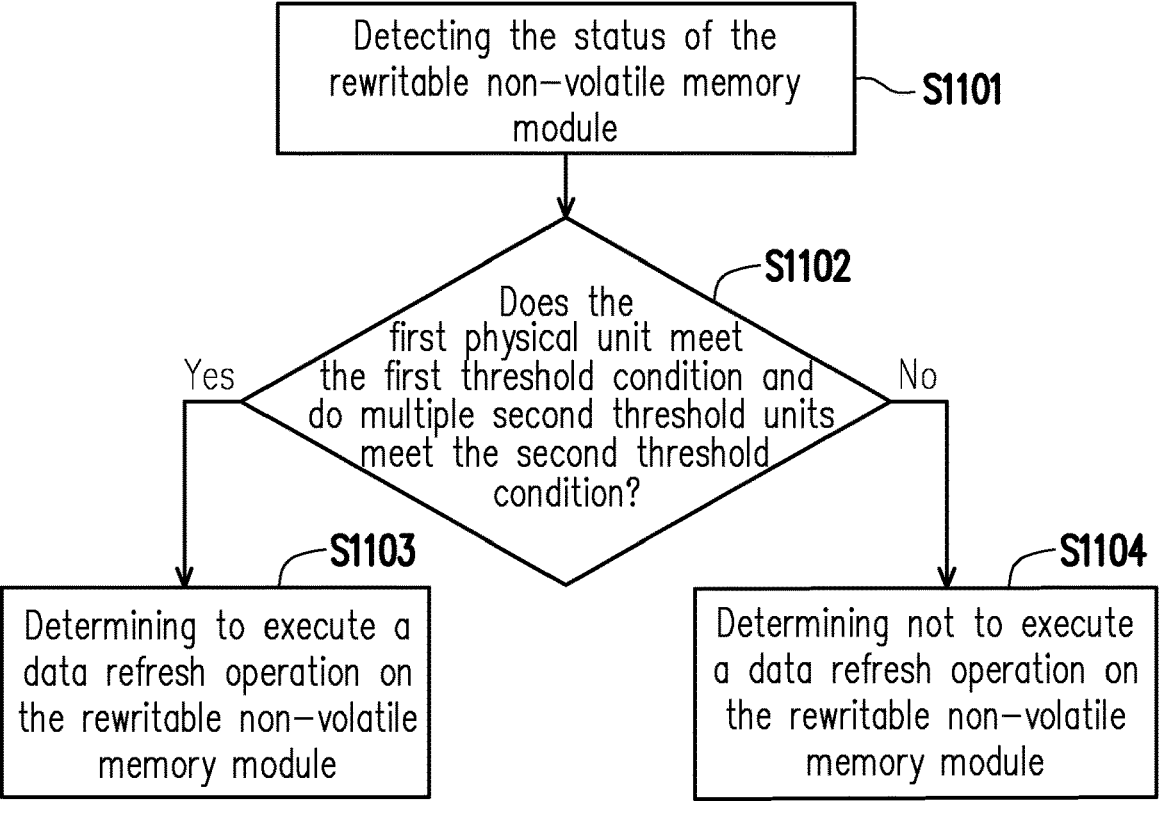
FIG. 11 is a flowchart of a memory management method according to an exemplary embodiment of the disclosure.

FIG. 11 is a flowchart of a memory management method according to an exemplary embodiment of the disclosure. Referring to FIG. 11, in step S1101, the status of the rewritable non-volatile memory module is detected. In step S1102, it is determined whether the first physical unit meets the first threshold condition and whether the second physical units meet the second threshold condition. If the first physical unit meets the first threshold condition and the second physical units meet the second threshold condition, in step S1103, it is determined to perform a data refresh operation on the rewritable non-volatile memory module. However, if the first physical unit does not meet the first threshold condition and/or the second physical units do not meet the second threshold condition, in step S1104, it is determined to not perform a data refresh operation on the rewritable non-volatile memory module.

However, each step in FIG. 8 to FIG. 11 has been described in detail as the above, and are not repeated herein. It should be noted that each step in FIG. 8 to FIG. 11 may be implemented as multiple codes or circuits, which is not limited by the disclosure. In addition, the methods of FIG. 8 to FIG. 11 may be used in conjunction with the above exemplary embodiments, or may also be used alone, which is not limited by the disclosure.

To sum up, the memory management method, memory storage device, and memory control circuit unit provided by the disclosure may determine whether to perform a data refresh operation on a rewritable non-volatile memory module according to multiple conditions. This includes stopping or delaying data refresh operations on rewritable non-volatile memory modules under certain circumstances. In this way, it is possible to reduce the negative impact (e.g., causing a reduction in the read/write speed of the memory storage device) on the performance of the memory storage device caused by data refresh operations in non-essential situations, thereby improving the operational stability of the memory storage device.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A memory management method, configured for a rewritable non-volatile memory module, the memory management method comprising:

detecting a status of the rewritable non-volatile memory module;

determining to perform a data refresh operation on the rewritable non-volatile memory module according to a first-type value relative relationship between a first evaluation value and a first threshold value and a second-type value relative relationship between a second evaluation value and a second threshold value; and determining not to perform any data refresh operation on the rewritable non-volatile memory module according to a third-type value relative relationship between the first evaluation value and the first threshold value and a fourth-type value relative relationship between the second evaluation value and the second threshold value, wherein the first evaluation value related to a first physical unit in the rewritable non-volatile memory module, the second evaluation value related to a plurality of second physical units in the rewritable non-volatile memory module, and the data refresh operation is configured to update data in the rewritable non-volatile memory module to reduce a bit error rate of the data.

2. The memory management method according to claim 1, further comprising:

determining whether the first physical unit meets a first threshold condition according to a degree of loss of the first physical unit, wherein the degree of loss of the first physical unit is positively related to a data error rate of data read from the first physical unit.

3. The memory management method according to claim 2, further comprising:

evaluating the degree of loss of the first physical unit according to whether first data is decoded in a soft decoding mode during a process of decoding the first data read from the first physical unit.

4. The memory management method according to claim 1, further comprising:

determining whether the second physical units meet a second threshold condition according to at least one of a degree of loss of the second physical units and data access performance of the second physical units, wherein the degree of loss of the second physical units is positively related to a data error rate of data read from the second physical units, and the data access performance of the second physical units is positively related to a data access speed of the second physical units.

5. The memory management method according to claim 4, wherein determining whether the second physical units meet the second threshold condition according to the at least one of the degree of loss and the data access performance of the second physical units comprises:

determining whether the second physical units meet the second threshold condition according to a total number of physical units that meet the first threshold condition among the second physical units.

6. The memory management method according to claim 1, wherein determining to perform the data refresh operation on the rewritable non-volatile memory module according to the first-type value relative relationship between the first evaluation value and the first threshold value and the second-type value relative relationship between the second evaluation value and the second threshold value comprises:

in response to the first physical unit meeting a first threshold condition and the second physical units meeting a second threshold condition, determining to perform the data refresh operation on the rewritable non-volatile memory module.

7. The memory management method according to claim 1, further comprising:

performing the data refresh operation on a third physical unit in the rewritable non-volatile memory module that meets a first threshold condition after determining to perform the data refresh operation on the rewritable non-volatile memory module.

8. A memory storage device, comprising:

a connection interface unit, configured to couple to a host system;

a rewritable non-volatile memory module; and a memory control circuit unit, coupled to the connection interface unit and the rewritable non-volatile memory module, wherein the memory control circuit unit is configured to:

detect a status of the rewritable non-volatile memory module;

determine to perform a data refresh operation on the rewritable non-volatile memory module according to a first-type value relative relationship between a first evaluation value and a first threshold value and a second-type value relative relationship between a second evaluation value and a second threshold value; and determine not to perform any data refresh operation on the rewritable non-volatile memory module according to a third-type value relative relationship between the first evaluation value and the first threshold value and a fourth-type value relative relationship between the second evaluation value and the second threshold value, wherein the first evaluation value related to a first physical unit in the rewritable non-volatile memory module, the second evaluation value related to a plurality of second physical units in the rewritable non-volatile memory module, and the data refresh operation is configured to update data in the rewritable non-volatile memory module to reduce a bit error rate of the data.

9. The memory storage device according to claim 8, wherein the memory control circuit unit is further configured to:

determine whether the first physical unit meets a first threshold condition according to a degree of loss of the first physical unit, wherein the degree of loss of the first physical unit is positively related to a data error rate of data read from the first physical unit.

10. The memory storage device according to claim 9, wherein the memory control circuit unit is further configured to:

evaluate the degree of loss of the first physical unit according to whether first data is decoded in a soft decoding mode during a process of decoding the first data read from the first physical unit.

11. The memory storage device according to claim 8, wherein the memory control circuit unit is further configured to:

determine whether the second physical units meet a second threshold condition according to at least one of a degree of loss of the second physical units and data access performance of the second physical units, wherein the degree of loss of the second physical units is positively related to a data error rate of data read from the second physical units, and the data access performance of the second physical units is positively related to a data access speed of the second physical units.

12. The memory storage device according to claim 11, wherein the memory control circuit unit determining whether the second physical units meet the second threshold condition according to the at least one of the degree of loss and the data access performance of the second physical units further comprises:

determining whether the second physical units meet the second threshold condition according to a total number of physical units that meet the first threshold condition among the second physical units.

13. The memory storage device according to claim 8, wherein the memory control circuit unit determining to perform the data refresh operation on the rewritable non-volatile memory module according to the first-type value relative relationship between a first evaluation value and a first threshold value and the second-type value relative relationship between the second evaluation value and the second threshold value comprises:

in response to the first physical unit meeting a first threshold condition and the second physical units meeting a second threshold condition, determining to perform the data refresh operation on the rewritable non-volatile memory module.

14. The memory storage device according to claim 8, wherein the memory control circuit unit is further configured to:

performing the data refresh operation on a third physical unit in the rewritable non-volatile memory module that meets a first threshold condition after determining to perform the data refresh operation on the rewritable non-volatile memory module.

15. A memory control circuit unit, configured to control a rewritable non-volatile memory module, the memory control circuit unit comprising:

a host interface, configured to couple to a host system;

a memory interface, configured to couple to the rewritable non-volatile memory module; and a memory management circuit, coupled to the host interface and the memory interface, wherein the memory control circuit unit is configured to:

detect a status of the rewritable non-volatile memory module; and determine to perform a data refresh operation on the rewritable non-volatile memory module according to a first-type value relative relationship between a first evaluation value and a first threshold value and a second-type value relative relationship between a second evaluation value and a second threshold value; and determine not to perform any data refresh operation on the rewritable non-volatile memory module according to a third-type value relative relationship between the first evaluation value and the first threshold value and a fourth-type value relative relationship between the second evaluation value and the second threshold value, wherein the first evaluation value related to a first physical unit in the rewritable non-volatile memory module, the second evaluation value related to a plurality of second physical units in the rewritable non-volatile memory module, and the data refresh operation is configured to update data in the rewritable non-volatile memory module to reduce a bit error rate of the data.

16. The memory control circuit unit according to claim 15, wherein the memory management circuit is further configured to:

determine whether the first physical unit meets a first threshold condition according to a degree of loss of the first physical unit, wherein the degree of loss of the first physical unit is positively related to a data error rate of data read from the first physical unit.

17. The memory control circuit unit according to claim 16, wherein the memory management circuit is further configured to:

evaluate the degree of loss of the first physical unit according to whether first data is decoded in a soft decoding mode during a process of decoding the first data read from the first physical unit.

18. The memory control circuit unit according to claim 15, wherein the memory management circuit is further configured to:

determine whether the second physical units meet a second threshold condition according to at least one of a degree of loss of the second physical units and reading and writing performance of the second physical units, wherein the degree of loss of the second physical units is positively related to a data error rate of data read from the second physical units, and the reading and writing performance of the second physical units is positively related to the reading and writing speed of the second physical units.

19. The memory control circuit unit according to claim 18, wherein the memory management circuit determining whether the second physical units meet the second threshold condition according to the at least one of the degree of loss and the reading and writing performance of the second physical units further comprises:

determining whether the second physical units meet the second threshold condition according to a total number of physical units that meet the first threshold condition among the second physical units.

20. The memory control circuit unit according to claim 15, wherein the memory management circuit determining to perform the data refresh operation on the rewritable non-volatile memory module according to the first-type value relative relationship between the first evaluation value and the first threshold value and the second-type value relative relationship between the second evaluation value and the second threshold value comprises:

in response to the first physical unit meeting a first threshold condition and the second physical units meeting a second threshold condition, determining to perform the data refresh operation on the rewritable non-volatile memory module.

21. The memory control circuit unit according to claim 15, wherein the memory management circuit is further configured to:

performing the data refresh operation on a third physical unit in the rewritable non-volatile memory module that meets a first threshold condition after determining to perform the data refresh operation on the rewritable non-volatile memory module.

22. A memory storage device, comprising:

a connection interface unit, configured to couple to a host system;

a rewritable non-volatile memory module; and a memory control circuit unit, coupled to the connection interface unit and the rewritable non-volatile memory module, wherein the memory control circuit unit is configured to obtain a performance evaluation value according to data transmission amount per unit time between the memory storage device and the host system and determine whether to perform a data refresh operation on the rewritable non-volatile memory module according to the performance evaluation value, and the data refresh operation is configured to update data in the rewritable non-volatile memory module to reduce a bit error rate of the data.

* * * * *